(12) United States Patent  (10) Patent No.: US 7,473,605 B2
Anderson et al.  (45) Date of Patent: Jan. 6, 2009

(54) CORNER DOMINATED TRIGATE FIELD EFFECT TRANSISTOR

(75) Inventors: Brent A. Anderson, Jericho, VT (US); Andres Bryant, Burlington, VT (US); Jeffrey B. Johnson, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/866,435

(22) Filed: Oct. 3, 2007

(65) Prior Publication Data

US 2008/0090361 A1    Apr. 17, 2008

Related U.S. Application Data

(62) Division of application No. 11/164,216, filed on Nov. 15, 2005, now Pat. No. 7,326,976.

(51) Int. Cl.
    *H01L 21/336* (2006.01)
(52) U.S. Cl. ...................................... 438/283
(58) Field of Classification Search ................. 438/283
    See application file for complete search history.

(56) References Cited

U.S. PATENT DOCUMENTS

| 6,844,238 | B2 | 1/2005 | Yeo et al. |
| 6,855,583 | B1 | 2/2005 | Krivokapic et al. |
| 6,858,478 | B2 | 2/2005 | Chau et al. |
| 6,888,181 | B1 | 5/2005 | Liao et al. |
| 7,115,945 | B2 | 10/2006 | Lee et al. |
| 7,172,943 | B2 | 2/2007 | Yeo et al. |
| 7,186,599 | B2 | 3/2007 | Ahmed et al. |
| 2004/0075122 | A1 | 4/2004 | Lin et al. |
| 2004/0145000 | A1 | 7/2004 | An et al. |
| 2004/0266077 | A1 | 12/2004 | Yeo et al. |
| 2005/0017240 | A1 | 1/2005 | Fazan |
| 2005/0035415 | A1 | 2/2005 | Yeo et al. |

FOREIGN PATENT DOCUMENTS

JP    2000-101032    4/2000

*Primary Examiner*—Ha Tran T Nguyen
*Assistant Examiner*—Shaun Campbell
(74) *Attorney, Agent, or Firm*—Gibb & Rahman, LLC; Richard M. Kotulak, Esq.

(57) ABSTRACT

Disclosed are embodiments of a trigate field effect transistor that comprises a fin-shaped semiconductor body with a channel region and source/drain regions on either side of the channel region. Thick gate dielectric layers separate the top surface and opposing sidewalls of the channel region from the gate conductor in order to suppress conductivity in the channel planes. A thin gate dielectric layer separates the upper corners of the channel region from the gate conductor in order to optimize conductivity in the channel corners. To further emphasize the current flow in the channel corners, the source/drain regions can be formed in the upper corners of the semiconductor body alone. Alternatively, source/drain extension regions can be formed only in the upper corners of the semiconductor body adjacent to the gate conductor and deep source/drain diffusion regions can be formed in the ends of the semiconductor body.

20 Claims, 14 Drawing Sheets

CORNER DOMINATED TRIGATE FIELD EFFECT TRANSISTOR

CROSS-REFERENCE TO RELATED APPLICATION

This application is a Divisional of U.S. patent application Ser. No. 11/164,216, filed Nov. 15, 2005, now U.S. Pat. No. 7,326,976 the complete contents of which is incorporated herein by reference.

BACKGROUND OF THE INVENTION

1. Field of the Invention

The invention generally relates to field effect transistors and, more particularly, to a trigate field effect transistor structure and a method of forming the structure.

2. Description of the Related Art

Integrated circuit design decisions are often driven by device scalability and manufacturing efficiency. For example, multi-gated non-planar field effect transistors (FETs), such as fin-type FETs (finFETs) or trigate FETs, were developed to provide scaled devices with faster drive currents and reduced short channel effects over planar FETs. A finFET is a non-planar transistor in which the channel region is formed at the center of a thin semiconductor fin with the source/drain regions at opposing ends. Gates are formed on the opposing sidewalls of the semiconductor fin adjacent to the channel region. A trigate FET has a similar structure to that of finFET; however, the semiconductor fin width and height are such that gates can be formed on three sides of the channel region, including the top surface and the opposing sidewalls. A trigate FET offers additional performance leverage over a planar FET and particularly, better gate control, due to the two-dimensional effect of gate wrapping around the channel corners where the top surface and opposing sidewalls meet. However, this performance advantage is reduced by the horizontal and vertical channel planes at the top surface and opposing sidewalls of the channel region, respectively, which exhibit high parasitic capacitances. It would be advantageous over the prior art to provide a trigate FET that emphasizes the current carrying capability of the channel corners, while minimizing the parasitic capacitance exhibited in the channel planes.

SUMMARY OF THE INVENTION

In order to emphasize current flow in the channel corners of a trigate FET and to simultaneously suppress current flow in the horizontal and vertical channel planes, embodiments of an improved trigate field effect transistor (FET) and an associated method of forming the trigate FET are disclosed. The trigate FET comprises a fin-shaped semiconductor body with a channel region and source/drain regions on either side of the channel region. A thin gate dielectric layer wraps around the upper corners of the semiconductor body in the channel region and thick gate dielectric layers are positioned on the top surface and opposing sidewalls of the semiconductor body in the channel region. To further emphasize the current flow in the channel corners and to suppress current flow in the vertical and horizontal channel planes, the source/drain regions immediately adjacent to the channel region are located only in the upper corners of the semiconductor body.

More particularly, an embodiment of the trigate FET comprises a semiconductor body on a substrate. The semiconductor body can be fin-shaped and can have opposing sidewalls and ends as well as a top surface and upper corners at the junctions between the top surface and the opposing sidewalls.

The transistor can further comprise a first gate dielectric layer on the top surface, a second gate dielectric layer on the opposing sidewalls and a third gate dielectric layer on the upper corners. Specifically, the transistor can comprise a relatively thick first gate dielectric layer on the top surface of the semiconductor body in the channel region. The width of the first gate dielectric layer can be at least one third the width of the semiconductor body. Similarly, the transistor can comprise a relatively thick second gate dielectric layer on the opposing sidewalls of the semiconductor body in the channel region. The height of the second gate dielectric layer can be at least one third the height of the semiconductor body. The transistor can also comprise a relatively thin third gate dielectric layer that wraps around the upper corners of the semiconductor body in the channel region such that it is positioned on both the top surface and the opposing sidewalls between the first gate dielectric layer and the second gate dielectric layer, respectively. Each of these gate dielectric layers can be formed from different dielectric materials and can have different thicknesses. However, the first and second gate dielectric layers should each be thicker (e.g., at least approximately three times thicker) than the third gate dielectric layer so as to suppress current flow in the channel planes and emphasize current flow in the channel corners.

The transistor can further comprise a gate conductor formed on each of the three dielectric layers. The gate conductor can be either centered or offset between the opposing ends of the semiconductor body and defines the channel region of the transistor within the semiconductor body.

The transistor can also comprise source/drain regions within the semiconductor body. Specifically, the transistor can comprise doped source/drain regions in the upper corners of the semiconductor body adjacent to the gate conductor. These source/drain regions can comprise source/drain diffusion regions that extend from the gate conductor to the opposing ends of the semiconductor body. Alternatively, a first lower concentration of a dopant in the upper corners of the semiconductor body adjacent to the gate conductor can define source/drain extension regions and a second higher concentration of the dopant in the opposing ends of the semiconductor body can define source/drain diffusion regions.

An embodiment of the method of forming a trigate field effect transistor, as described above, comprises first depositing a relatively thick first dielectric material on a semiconductor layer. The first dielectric material is lithographically patterned on the top surface of the semiconductor layer to form a first gate dielectric layer. Sidewall spacers are then formed adjacent to the first gate dielectric layer and, particularly, adjacent to first gate dielectric layer sidewalls. The widths of the spacers and first gate dielectric material should be controlled so that the width of the first gate dielectric layer is at least one third the width of the subsequently formed semiconductor body.

After forming the sidewall spacers, a directional etch process is performed that is selective to the semiconductor layer in order to form a semiconductor body below the first gate dielectric layer and the sidewall spacers. Optionally, once the semiconductor body is formed, the sidewall spacers may be selectively removed.

A second gate dielectric layer is then formed on the opposing sidewalls of the semiconductor body. Forming the second gate dielectric layer can be accomplished by depositing a second dielectric material that is a different material and/or has a different thickness than the first dielectric material. If the sidewall spacers are not removed from the first gate dielectric layer and are formed from the same material as the second dielectric material, a relatively thick blanket layer of the second dielectric material can be deposited onto the opposing sidewalls of the semiconductor body, onto the sidewall spacers and onto the first gate dielectric layer. Then, a selective directional etch process can be performed in order to remove the second dielectric material from the first gate dielectric layer and from the sidewall spacers, to completely remove the sidewall spacers, and to remove the second dielectric material from the opposing sidewalls of the semiconductor body at the upper corners. The directional etch process can be controlled so that a remaining portion of the second dielectric material on the opposing sidewalls forms the second gate dielectric layer and such that the second gate dielectric layer has a height that is at least one third the height of the opposing sidewalls.

Alternatively, if the sidewall spacers are removed from the first gate dielectric layer, a blanket layer of the second dielectric material can be deposited onto the opposing sidewalls and the exposed portions of the top surface of the semiconductor body and onto the first gate dielectric layer. Then, a selective directional etch process can be performed to remove the second dielectric material from the first gate dielectric layer and from the top surface and opposing sidewalls of the semiconductor body at the upper corners. Again, this directional etch process can be controlled so that a remaining portion of the second dielectric material on the opposing sidewalls forms the second gate dielectric layer and so that the second gate dielectric layer has a height that is at least one third the height of the opposing sidewalls.

Once the first and second gate dielectric layers are formed, as described above, a third gate dielectric layer can be formed on the exposed upper corners of the semiconductor body adjacent to both the first gate dielectric layer on the top surface and the second gate dielectric layer on the opposing sidewalls. Specifically, the third gate dielectric layer can be formed by growing an oxide layer on the semiconductor body around the upper corners. The growth of the oxide layer can be controlled so that the third gate dielectric layer is formed less than approximately ⅓ as thick as the first and/or the second gate dielectric layers.

After each of the gate dielectric layers is formed a gate conductor can be deposited and lithographically patterned on the semiconductor body over the gate dielectric layers. The patterned gate conductor can be either centered or offset between the opposing ends of the semiconductor body so as to define the channel region of the FET.

Once the gate conductor is formed, source/drain regions can be formed in the semiconductor body by either an implantation process, an outdiffusion process or a combination of implantation and outdiffusion processes.

In one embodiment of the invention in order to further emphasize the channel corners of the resulting trigate FET and suppress the channel planes, source/drain regions can be formed in the upper corners (alone) of the semiconductor body adjacent to the gate conductor. For example, the upper corners of the semiconductor body that extend from the gate conductor to the opposing ends and that are not blocked by the gate conductor or the thick gate dielectric layers (i.e., the first and second gate dielectric layers) can be implanted with a dopant to form source/drain diffusion regions. Alternatively, the oxide layer (i.e., the third gate dielectric layer) that was previously grown on the upper corners of the semiconductor body (and not blocked by the gate conductor) can be selectively removed. Then, a film with a high doping level can be deposited so that the dopant can outdiffuse from the film into the exposed semiconductor body at the upper corners from the gate conductor to the opposing ends.

In another embodiment of the invention in order to further emphasize the channel corners of the resulting trigate FET and suppress the channel planes, source/drain extension regions can be formed in the upper corners adjacent to the gate conductor and deep source/drain diffusion regions can be formed throughout the opposing ends of the semiconductor body. For example, portions of the first gate dielectric layer and the oxide layer (i.e., the third gate dielectric layer) on the top surface of the semiconductor body at the opposing ends can be selectively removed. Then, an implantation process can be performed such that a first lower concentration of dopants is implanted into the upper corners of the semiconductor body adjacent to the gate conductor to form source/drain extension regions and a second higher concentration of the dopant is implanted into the opposing ends of the semiconductor body to form source/drain diffusion regions. Alternatively, in addition to removing the oxide layer from the opposing ends, the oxide layer can be selectively removed from the upper corners as well. Then, a film with a high doping level can be deposited so that the dopant can be outdiffused into the exposed semiconductor at the upper corners and the opposing ends. This outdiffusion process can be controlled so that a first lower concentration of dopants is outdiffused into the upper corners of the semiconductor body adjacent to the gate conductor to form source/drain extension regions and a second higher concentration of the dopant is outdiffused into the opposing ends of the semiconductor body to form source/drain diffusion regions. Alternatively, the different doping levels in the source/drain extension regions and the deep source/drain diffusion regions can be achieved by a combination of the above-described implantation and outdiffusion processes.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 3b is a schematic diagram illustrating a side cross section through off-center plane B (see FIG. 2) of the embodiment of FIG. 3a;

FIG. 4b is a schematic diagram illustrating a side cross section through off-center plane B (see FIG. 2) of the embodiment of FIG. 4a;

DETAILED DESCRIPTION OF PREFERRED EMBODIMENTS OF THE INVENTION

Figure 1:
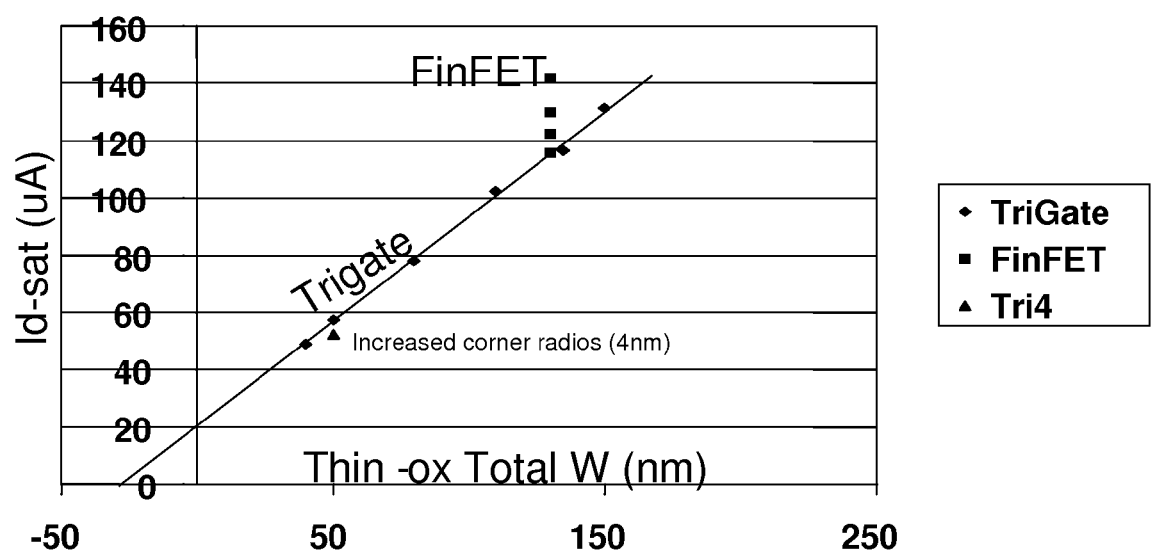
FIG. 1 is a schematic graph illustrating channel corner conduction in a trigate FET.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, a trigate field effect transistor (trigate FET) has a similar structure to that of fin-type field effect transistor (finFET); however, in a trigate FET the semiconductor fin width and height are such that gates (i.e., a gate dielectric-gate conductor stack) can be formed on three sides of the channel region, including the top surface and the opposing sidewalls. Trigate FETs offer additional performance leverage over planar FETs and particularly, better gate control, due to the two-dimensional effect of gate wrapping around the channel corners (i.e., around the upper corners of the channel region where the top surface and opposing sidewalls meet). However, this performance advantage is reduced by the horizontal channel plane and parallel vertical channel planes (i.e., the vertical and horizontal planes that are form at the top surface and opposing sidewalls, respectively, of the channel region of the semiconductor fin). Specifically, these channel planes exhibit high parasitic capacitances and thus, inhibit the performance advantage of the channel corners. For example, the graph of FIG. 1 illustrates simulation results of the drain current (Id-sat) of trigate FETs compared to the total width of channel region (i.e., twice the height plus the width of the semiconductor fin). The x-intercept is approximately −30 nm as opposed to zero. This negative value for the x-intercept indicates that the upper corners in the channel region of a trigate FET deliver as much current as a 30 nm wide planar device. However, to obtain the full advantage of the conduction exhibited in these channel corners, the planar parts of the trigate FET would necessarily be much less than ⅓×30 nm (i.e., less than 10 nm) in size. Unfortunately, such dimensions are challenging to manufacture and can result in mobility degradation.

Figure 2:
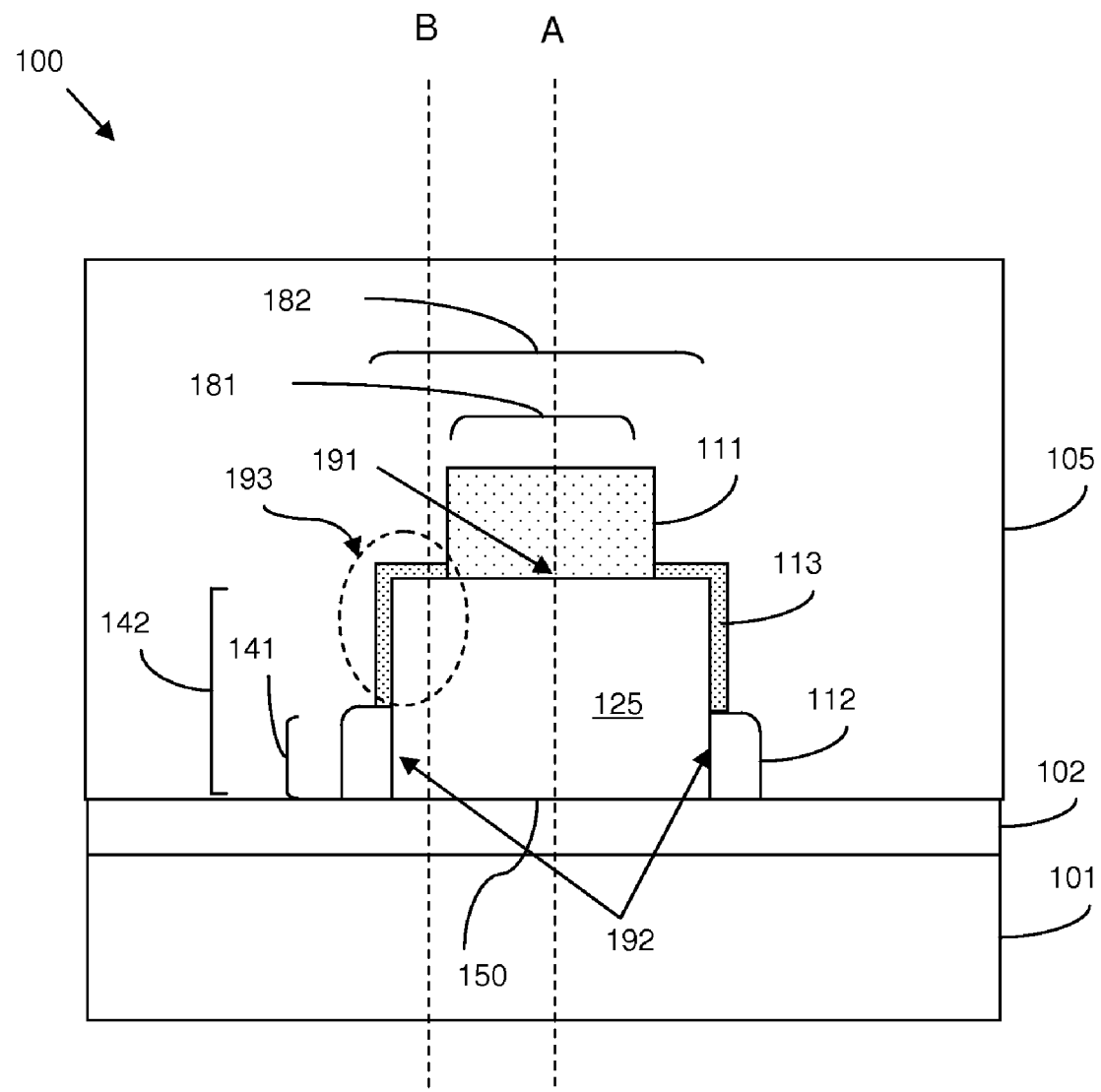
FIG. 2 is a schematic diagram illustrating a front cross section of an embodiment of a trigate FET of the invention.

Therefore, disclosed are embodiments of a trigate FET structure that suppresses the vertical and horizontal channel planes so as to minimize parasitic capacitances, that optimizes the current carrying capabilities of the channel corners and that has dimensions that can be manufactured using current state-of-the art technology. FIG. 2 is a diagram illustrating a front view cross section through the channel region of an embodiment of a trigate FET of the invention. FIG. 3 is a diagram illustrating a side view cross section through the source/drain region of the trigate FET of FIG. 2. FIG. 4 is a diagram illustrating a side view cross section through a differently configured source/drain region of FIG. 2. Referring to FIGS. 2-4 in combination, an embodiment of the trigate FET 100 of the invention can comprise a fin-shaped semiconductor body 150 that comprises a channel region 125 and source/drain regions (see 120 of FIGS. 3 and 120*a-b* of FIG. 4) on both sides of the channel region 125. A thin gate dielectric layer 113 wraps around the upper corners 193 of the semiconductor body 150 in the channel region 125 to emphasize the current carrying capability of the channel corners. Additionally, thick gate dielectric layers 111, 112 are positioned on the top surface 191 and opposing sidewalls 192 of the semiconductor body 150 in the channel region 125 to suppress current flow in the channel planes. To further emphasize the current flow in the channel corners and to suppress current flow in the channel planes, source/drain regions (e.g., the source/drain diffusion regions 120 of FIG. 3 and the source/drain extension regions 120*a* of FIG. 4) are located immediately adjacent to the channel region 125 but only in the upper corners 193 of the semiconductor body 150, where the top surface 191 and the opposing sidewalls 192 meet.

More particularly, an embodiment of the trigate transistor 100 comprises a semiconductor (e.g., a silicon or silicon germanium) body 150 on a substrate 110 (e.g., on a buried oxide 102-silicon 101 stack of a silicon-on-insulator (SOI) wafer). The semiconductor body 150 can be fin-shaped with a height 142 that can be approximately 10-100 nm and the width 182 that can range between ½ to 2 times this height 142. The semiconductor body 150 can have opposing sidewalls 192 and ends 194, a top surface 191 and upper corners 193 at the junctions between the top surface 191 and the opposing sidewalls 192.

The transistor 100 can further comprise a first gate dielectric layer 111 on the top surface 191, a second gate dielectric layer 112 on the opposing sidewalls 192 and a third gate dielectric layer 113 on the upper corners 193. Specifically, the transistor 100 can comprise a relatively thick first gate dielectric layer 111 (e.g., an approximately 3-30 nm thick oxide layer) on the top surface 191 of the channel region 125 of the semiconductor body 150. The width 181 of the first gate dielectric layer 111 can be at least one third the width 182 of the semiconductor body 150. Similarly, the transistor 100 can comprise a relatively thick second gate dielectric layer 112 (e.g., an approximately 3-30 nm thick nitride layer) on the opposing sidewalls 192 of the channel region 125 of the semiconductor body 150. The height 141 of the second gate dielectric layer 112 can be at least one third the height 142 of the semiconductor body 150. The transistor 100 can also comprise a relatively thin third gate dielectric layer 113 (e.g., an approximately 1-10 nm oxide layer) that wraps around the upper corners 193 of the channel region 125 of the semiconductor body 150 such that it is positioned on both the top surface 191 and the opposing sidewalls 192 between the first gate dielectric layer 111 and the second gate dielectric layer 112, respectively. Each of the gate dielectric layers 111, 112, 113 can be formed from different dielectric materials (e.g., nitrides, oxides, or other suitable dielectric materials) and can have different thicknesses. However, the first 111 and second 112 gate dielectric layers should each be thicker (e.g., at least approximately three times thicker) than the third gate dielectric layer 113 so as to suppress current flow in the channel planes and emphasize current flow in the channel corners.

The transistor 100 can further comprise a gate conductor 105 that is formed on each of the three dielectric layers 111, 112, 113. The gate conductor 105 can be either centered or offset between the opposing ends 194 of the semiconductor body 150 so as to define the channel region 125 of the transistor 100.

Figure 3A:
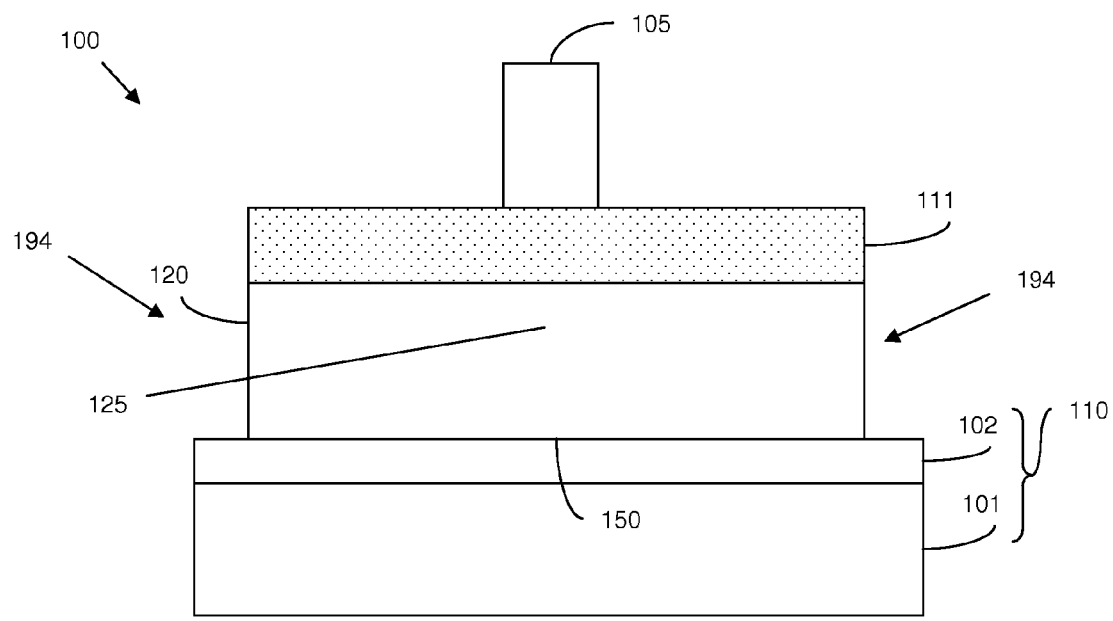
FIG. 3a is a schematic diagram illustrating a side cross section through center plane A (see FIG. 2) of another embodiment of the trigate FET of the invention.
Figure 3B:
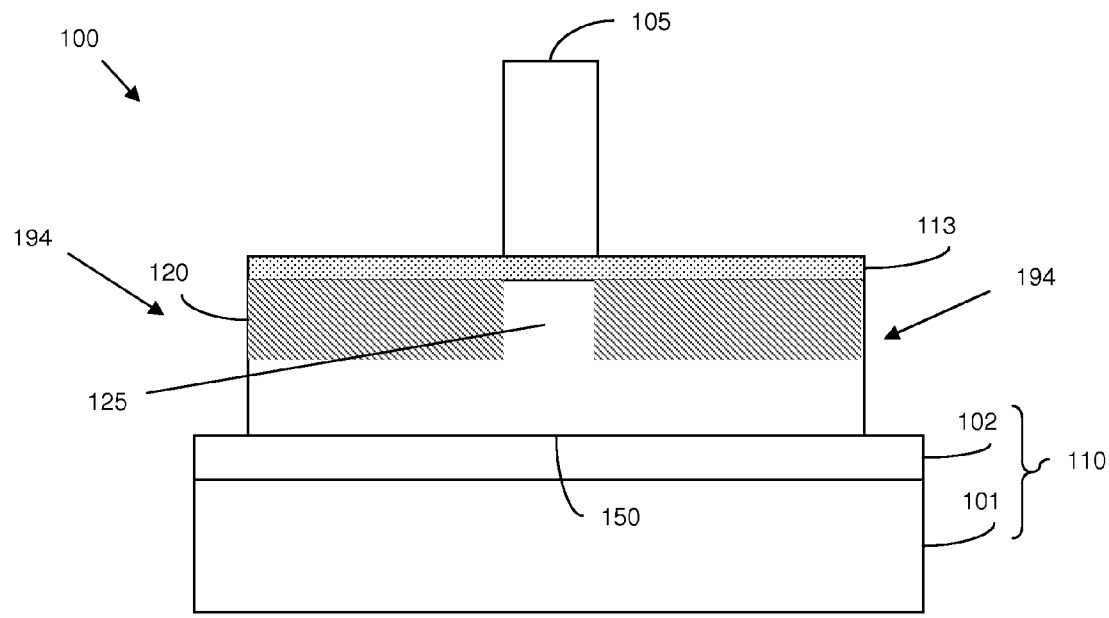

The transistor 100 can also comprise source/drain regions within the semiconductor body on both sides of the gate conductor 105. Specifically, transistor 100 can comprise doped source/drain regions in the upper corners 193 of the semiconductor body. Referring to FIGS. 3a-b, in one embodiment of the invention these source/drain regions can comprise source/drain diffusion regions 120 that extend from the gate conductor 105 to the opposing ends 194 of the semiconductor body. Thus, referring particularly to FIG. 3A, the side view cross section through center plane A (see FIG. 2) illustrates that doped source/drain regions 120 of this embodiment are not located along the center of the semiconductor body 120, Additionally, referring particularly to FIG. 3B, the side view cross section through the off-center plan B (see FIG. 2), illustrates that the doped source/drain regions 120 of this embodiment are located in the upper corners 193 and extend from the opposing ends 194 to the gate conductor 105.

Figure 4A:
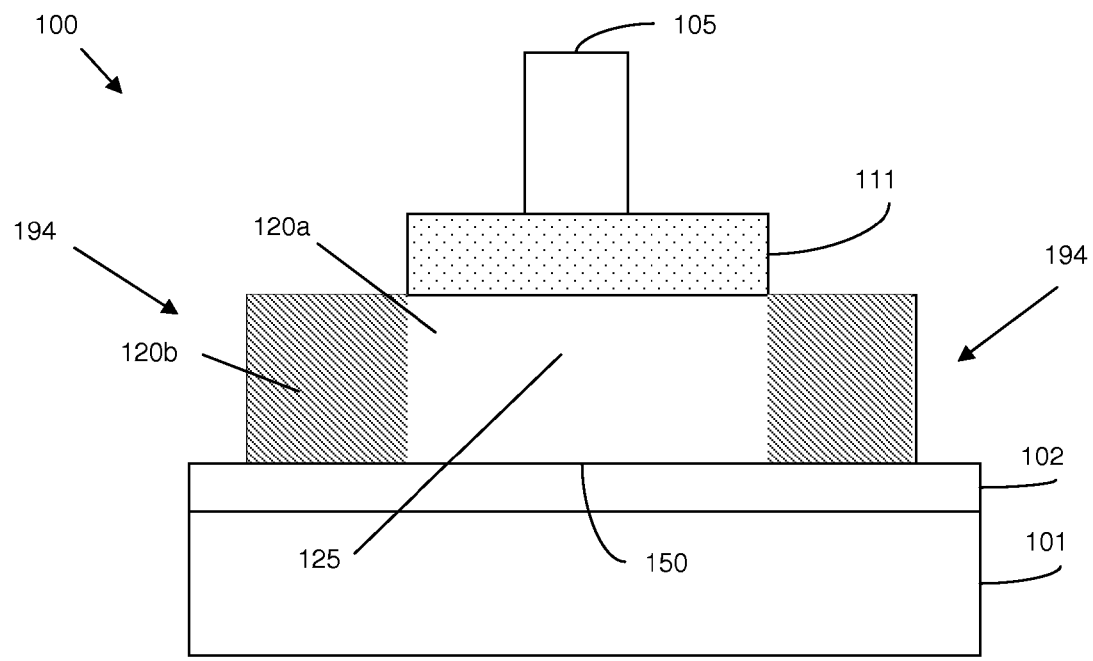
FIG. 4a is a schematic diagram illustrating a side cross section through center plane A (see FIG. 2) of another embodiment of the trigate FET of the invention.
Figure 4B:
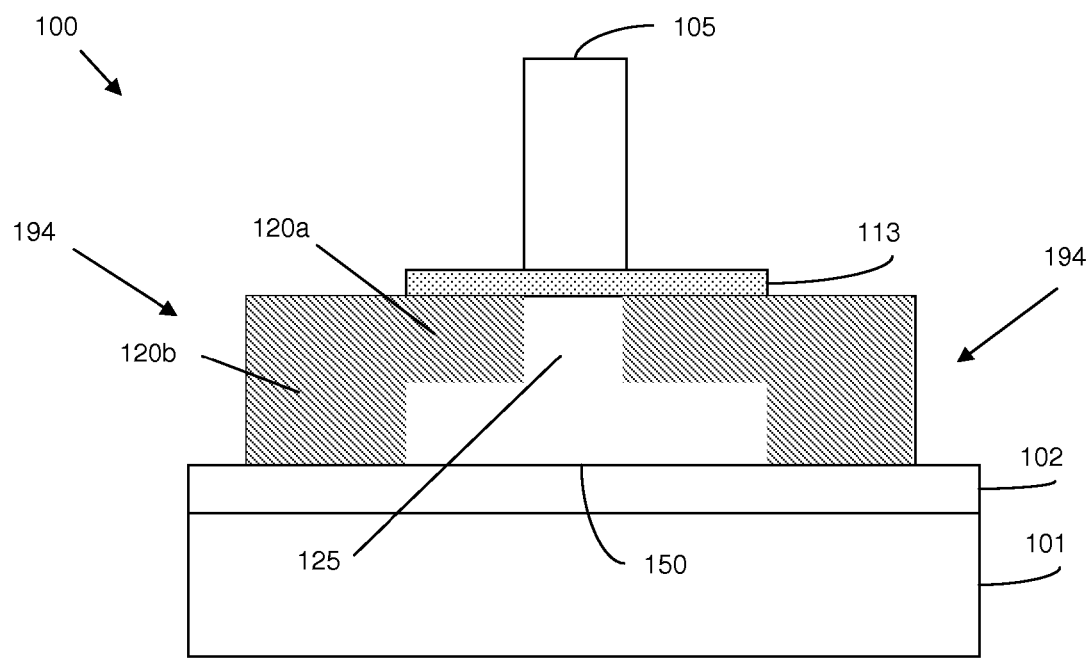

Alternatively, referring to FIGS. 4a-b, in another embodiment of the invention, the upper corners 193 adjacent to the gate conductor 105 may contain a first lower concentration of dopants to define source/drain extension regions 120a and the opposing ends 194 of the semiconductor body 150 (not limited to the corners alone) may contain a second higher concentration of the dopant to define deep source/drain diffusion regions 120b. Thus, referring particularly to FIG. 4A, the side view cross section through center plane A (see FIG. 2) illustrates that the doped source/drain extension regions 120a of this embodiment are not located along the center of the semiconductor body 120. Additionally, referring particularly to FIG. 4B, the side view cross section through the off-center plan B (see FIG. 2), illustrates that the doped source/drain diffusion regions 120b of this embodiment are located throughout the semiconductor body at the opposing ends 194.

Figure 5:
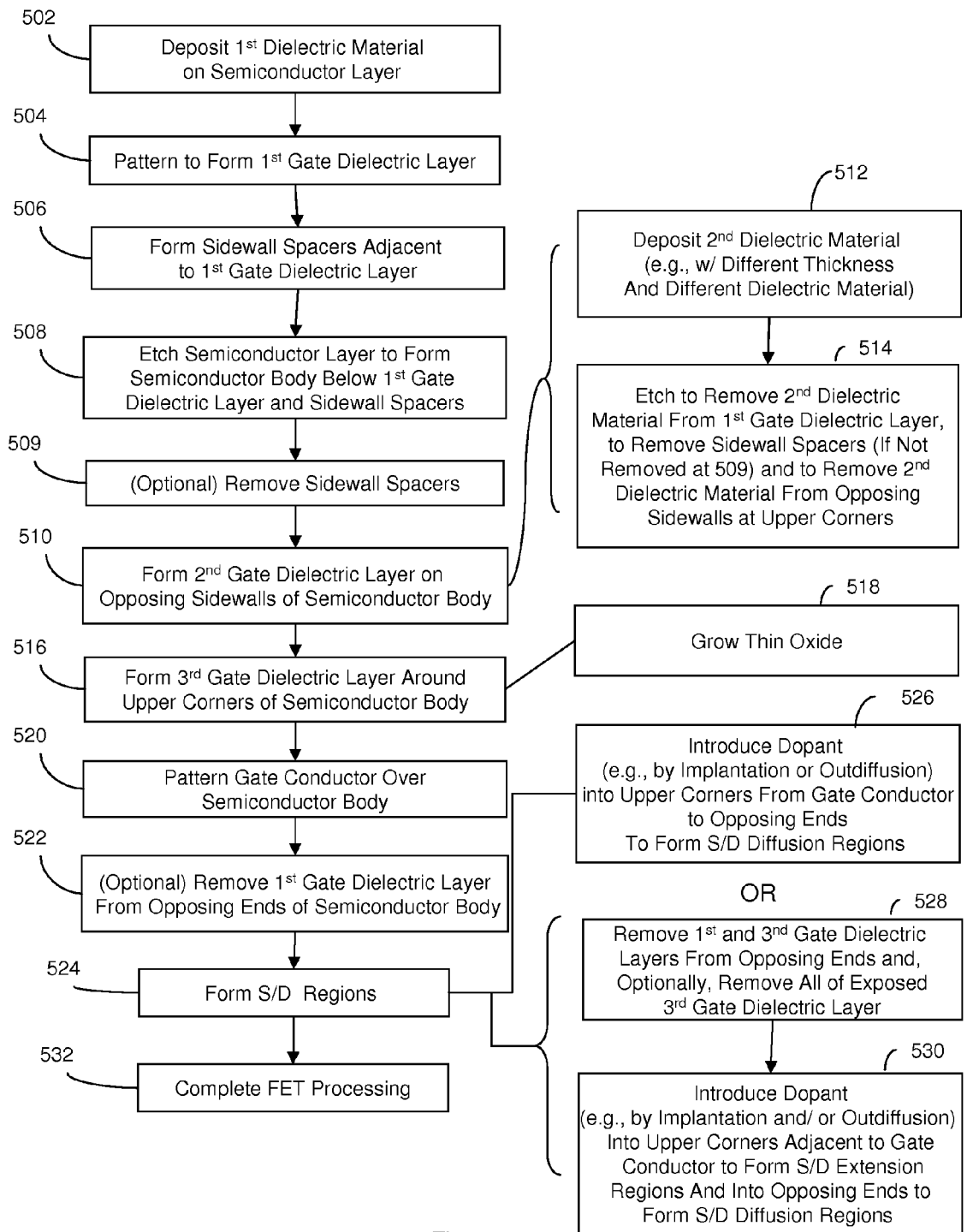
FIG. 5 is a flow diagram illustrating an embodiment of a method of forming a trigate FET.
Figure 6:
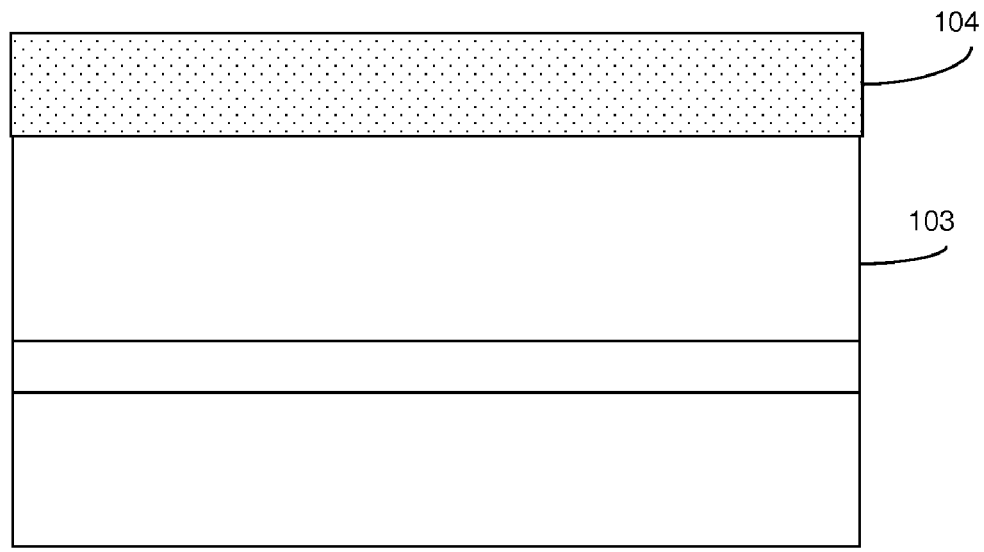
FIG. 6 is a schematic diagram illustrating a front cross section of a partially completed structure of the invention.

Referring to FIG. 5, an embodiment of the method of forming a trigate field effect transistor 100, as described above, comprises first depositing a relatively thick first dielectric material 104 (e.g., an approximately 3-30 nm thick oxide layer) on a semiconductor layer 103 (e.g., an approximately 10-100 nm semiconductor layer 103 on a silicon-on-insulator (SOI) wafer) (502, see FIG. 6). The first dielectric material 104 is then lithographically patterned on the top surface 191 of the semiconductor layer 103 to form a first gate dielectric layer 111 (504, see FIG. 7). The first gate dielectric layer 111 may be formed with a predetermined width 181 that is equal to a current state-of-the-art minimum lithographic dimension.

Figure 7:
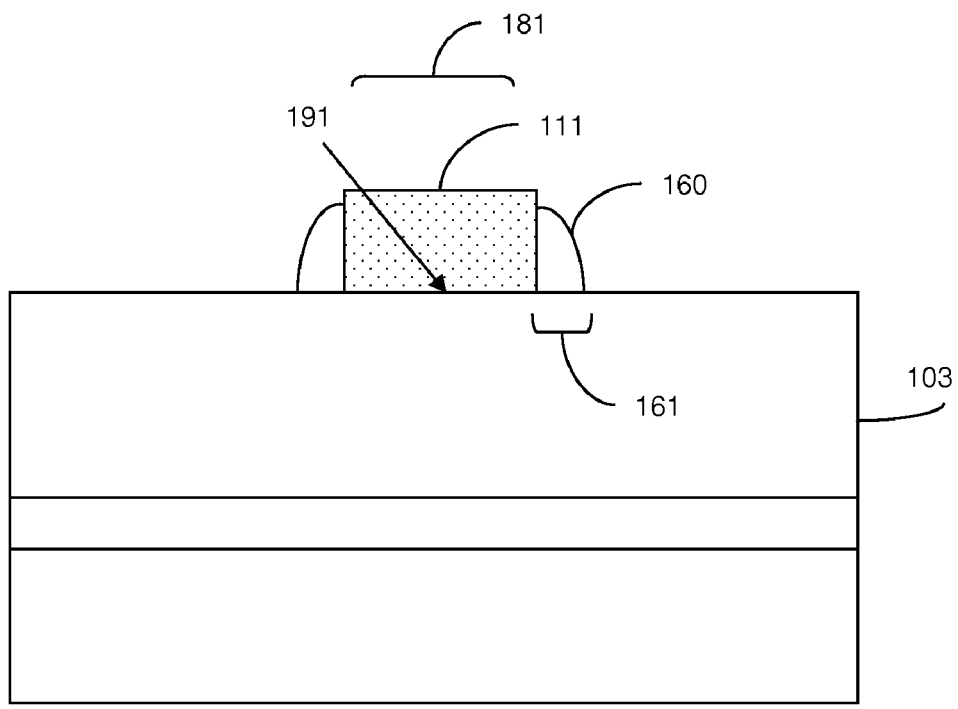
FIG. 7 is a schematic diagram illustrating a front cross section of a partially completed structure of the invention.

Sidewall spacers 160 (e.g., approximately 3-30 nm wide nitride spacers) are then formed adjacent to the first gate dielectric layer 111 and, particularly, adjacent to first gate dielectric layer sidewalls (506, see FIG. 7). The sidewall spacers 160 may be formed using conventional methods for sidewall spacer formation. However, the widths 161 and 181 of the sidewall spacers 160 and the first gate dielectric layer 111, respectively, should be controlled so as to control the relative width of the first gate dielectric layer 111 as compared to the width of the subsequently formed semiconductor body. Specifically, the width of the semiconductor body 150 (see item 182 of FIG. 2) will be equal to the combined widths of the spacers 160 and the first gate dielectric layer 111. To ensure adequate suppression of current flow in the horizontal channel plane, the widths 161 and 181 of the spacers 160 and first gate dielectric material 141, respectively, should be controlled so that the width 181 of the first gate dielectric layer 111 is at least one third the width 182 of the semiconductor body 150.

Figure 8:
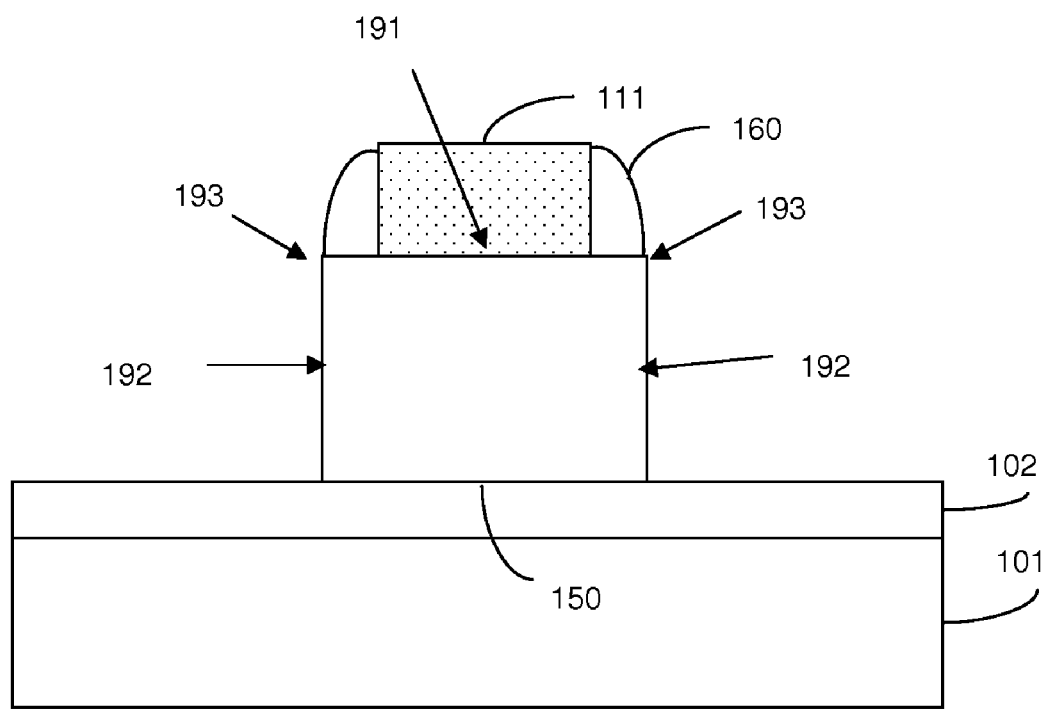
FIG. 8 is a schematic diagram illustrating a front cross section of a partially completed structure of the invention.
Figure 9:
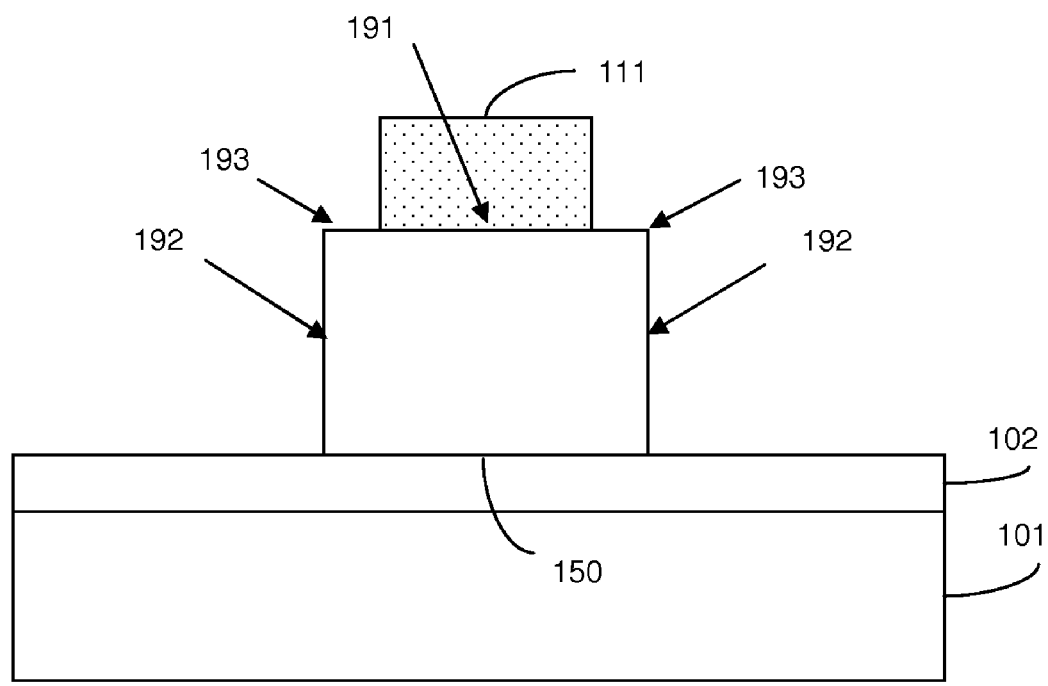
FIG. 9 is a schematic diagram illustrating a front cross section of a partially completed structure of the invention.

After forming the sidewall spacers (at process 506), a directional etch process is performed that is selective to the semiconductor layer 103 in order to form a fin-shaped semiconductor body 150 below the first gate dielectric layer 111 and the sidewall spacers 160 (508, see FIG. 8). Optionally, once the semiconductor body is formed, the sidewall spacers may be selectively removed (509, see FIG. 9).

Figure 10:
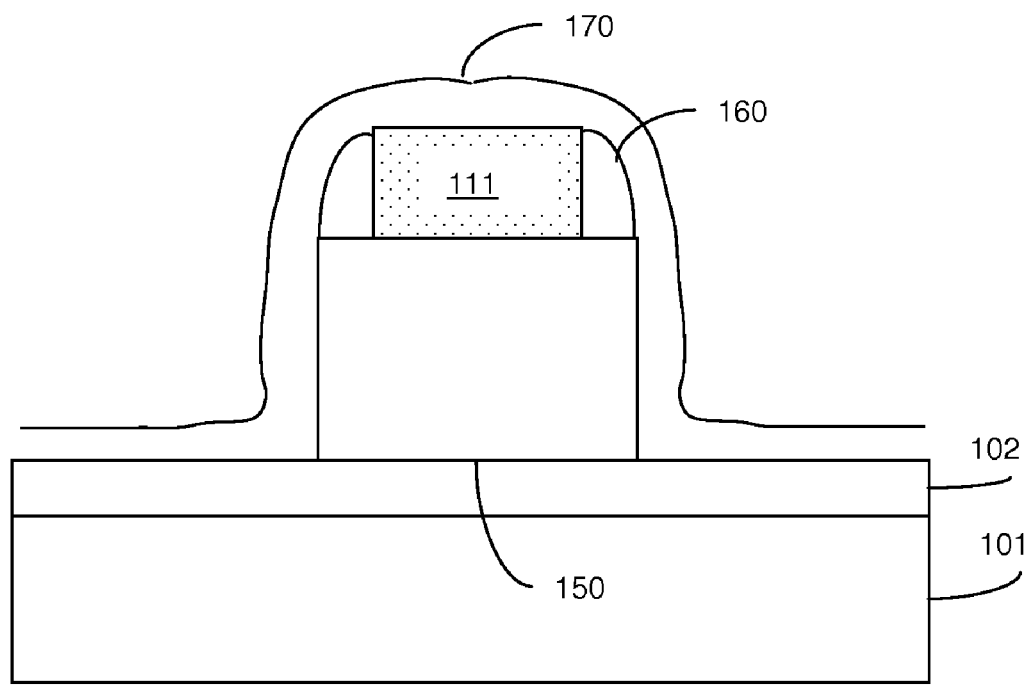
FIG. 10 is a schematic diagram illustrating a front cross section of a partially completed structure of the invention.
Figure 12:
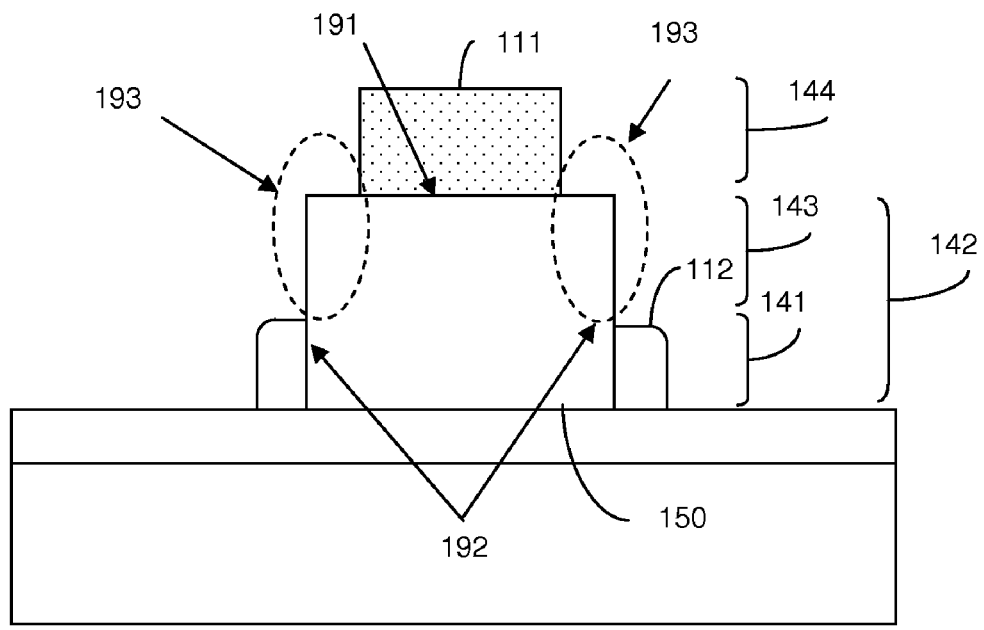
FIG. 12 is a schematic diagram illustrating a front cross section of a partially completed structure of the invention.

A second gate dielectric layer is then formed on the opposing sidewalls 192 of the semiconductor body 150 (510). Forming the second gate dielectric layer can be accomplished by depositing a second dielectric material that is a different material and/or has a different thickness than the first dielectric material (512). Referring to FIG. 10, if the sidewall spacers 160 are not removed from the first gate dielectric layer 111 and are formed from the same material as the second dielectric material 170 (e.g., a nitride), a relatively thick blanket layer of the second dielectric material 170 (e.g., an approximately 3-30 nm thick blanket nitride layer) can be deposited onto the opposing sidewalls 192 of the semiconductor body 150, onto the sidewall spacers 160 and onto the first gate dielectric layer 111 (512). Then, a selective directional etch process can be performed in order to remove the second dielectric material 170 from the first gate dielectric layer 111 and from the sidewall spacers 160, to completely remove the sidewall spacers 160, and to remove a portion of the second dielectric material 170 from the opposing sidewalls 192 of the semiconductor body 150 at the upper corners 193 (514, see FIG. 12). Additionally, this directional etch process (514) can be controlled so that a portion of the second dielectric material remains on the opposing sidewalls 192 to form the second gate dielectric layer 112 and such that this second gate dielectric layer 112 has a height 141 that is at least one third the height 142 of the opposing sidewalls 192. Note that if this technique is used, the directional etch process (514) must be specifically controlled so that the sidewall spacers 160 are entirely removed and the top surface of the semiconductor layer at the upper corners 193 is exposed. Thus, the depth 143 of the second dielectric material 170 that is removed from the opposing sidewalls 192 must be at least equal to the height of the sidewall spacers 160 (i.e., the thickness 144 of the first gate dielectric layer).

Figure 11:
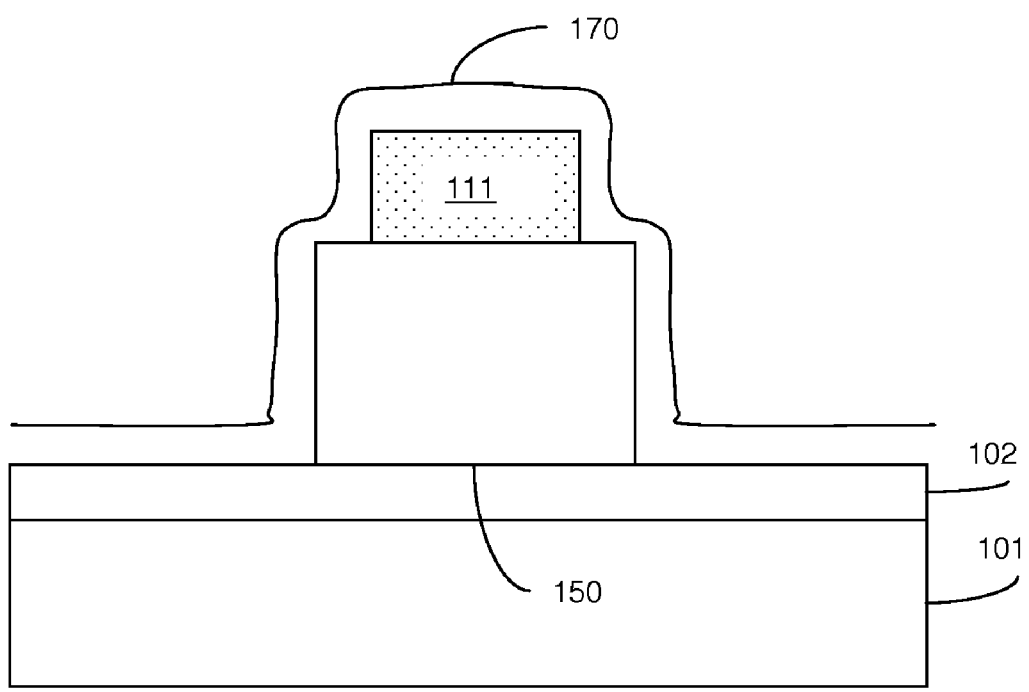
FIG. 11 is a schematic diagram illustrating a front cross section of a partially completed structure of the invention.

Alternatively, referring to FIG. 11, if the sidewall spacers are removed from the first gate dielectric layer (at process 509), a blanket layer of the second dielectric material 170 can be deposited onto the opposing sidewalls 192 and the exposed portions of the top surface 191 of the semiconductor body 150 and onto the first gate dielectric layer 111 (510). Then, a selective directional etch process can be performed to remove the second dielectric material from the first gate dielectric layer and from the top surface and opposing sidewalls of the semiconductor body at the upper corners (514). Again, this directional etch process can be controlled so that a portion of the second dielectric material remaining on the opposing sidewalls 192 forms the second gate dielectric layer 112 and so that this second gate dielectric layer 112 has a height 141 that is at least one third the height 142 of the opposing sidewalls 192. Note that if this technique is used, the depth 143 of the second dielectric material 170 that is removed from the opposing sidewalls 192 may be less than the thickness 144 of the first gate dielectric material. Additionally, the sidewall spacer material may be different than the second dielectric material.

Figure 13:
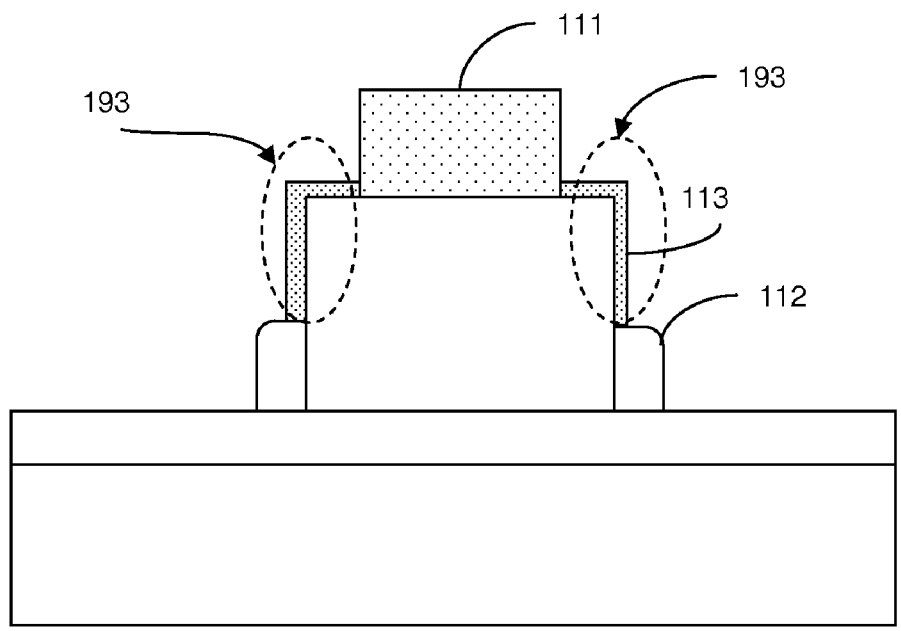
FIG. 13 is a schematic diagram illustrating a front cross section of a partially completed structure of the invention.

Once the first and second gate dielectric layers are formed (at processes 502-514), as described above, a relatively thin third gate dielectric layer 113 can be formed on the exposed upper corners 193 of the semiconductor body 150 adjacent to both the first gate dielectric layer 111 on the top surface 191 and the second gate dielectric layer 112 on the opposing sidewalls 192 (516, see FIG. 13). Specifically, the third gate dielectric layer 113 can be formed, for example, by growing an approximately 1-10 nm oxide layer on the semiconductor body 150 around the upper corners 193 (518). The growth of the oxide layer can be controlled so that the third gate dielectric layer 113 is formed less than approximately ⅓ as thick as the first 111 and/or the second 112 gate dielectric layers.

Figure 14:
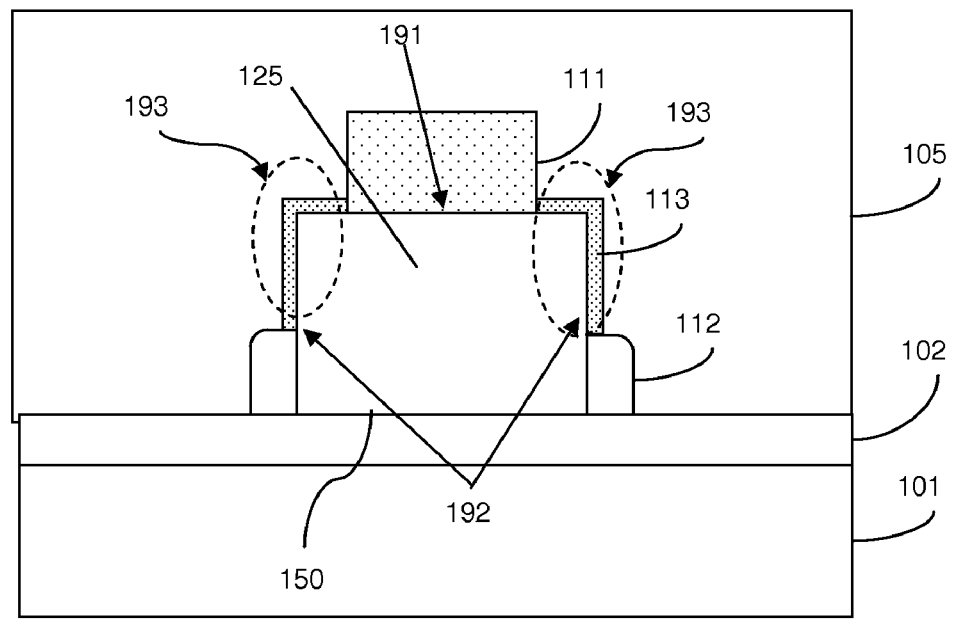
FIG. 14 is a schematic diagram illustrating a front cross section of a partially completed structure of the invention.
Figure 15:
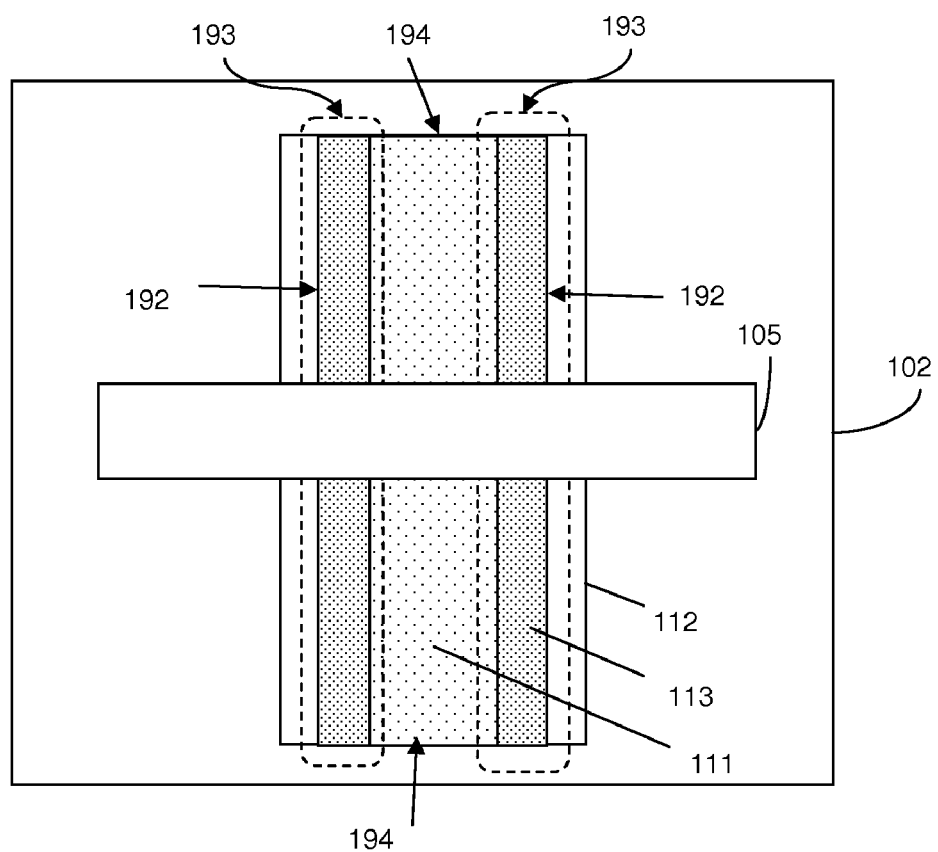
FIG. 15 is a schematic diagram illustrating a top view of FIG. 14.

After each of the gate dielectric layers is formed (a processes 502-518), a gate conductor 105 can be deposited and lithographically patterned on the semiconductor body 150 over the gate dielectric layers 111, 112, 113 (520). FIGS. 14 and 15 illustrate a front cross section and a top view of the partially completed trigate FET 100 of the invention following process 520. The patterned gate conductor 105 can be either centered or offset between the opposing ends 194 of the semiconductor body 150 so as to define the channel region 125 of the FET.

Once the gate conductor 105 is formed (at process 520), source/drain regions 120 can be formed by introducing an appropriate dopant into the semiconductor body adjacent to the channel region 125. This can be accomplished using well-known processing techniques, for example, by either an implantation process or an outdiffusion process (524). Specifically, a p-type dopant (e.g., boron) can be introduced to form source/drain regions of a p-FET or n-type dopants (e.g., phosphorus, arsenic or antimony) can be introduced to form source/drain regions of an n-FET.

Figure 16:
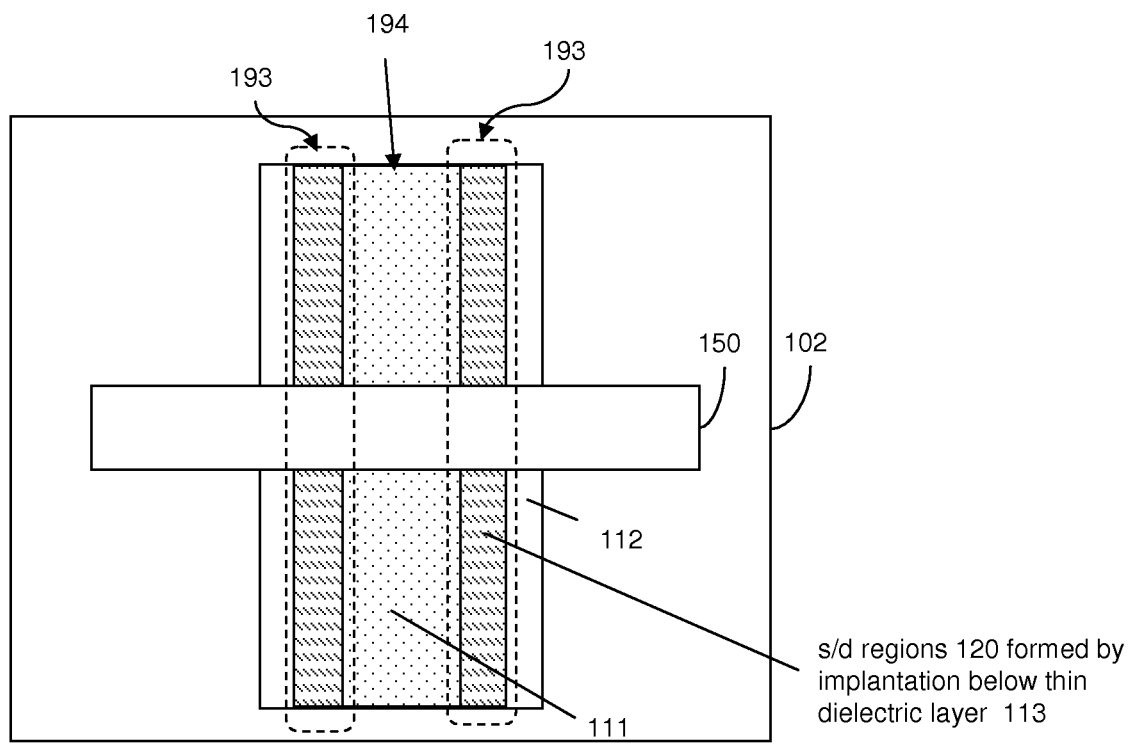
FIG. 16 is a schematic diagram illustrating a top view of a partially completed structure of the invention.
Figure 17:
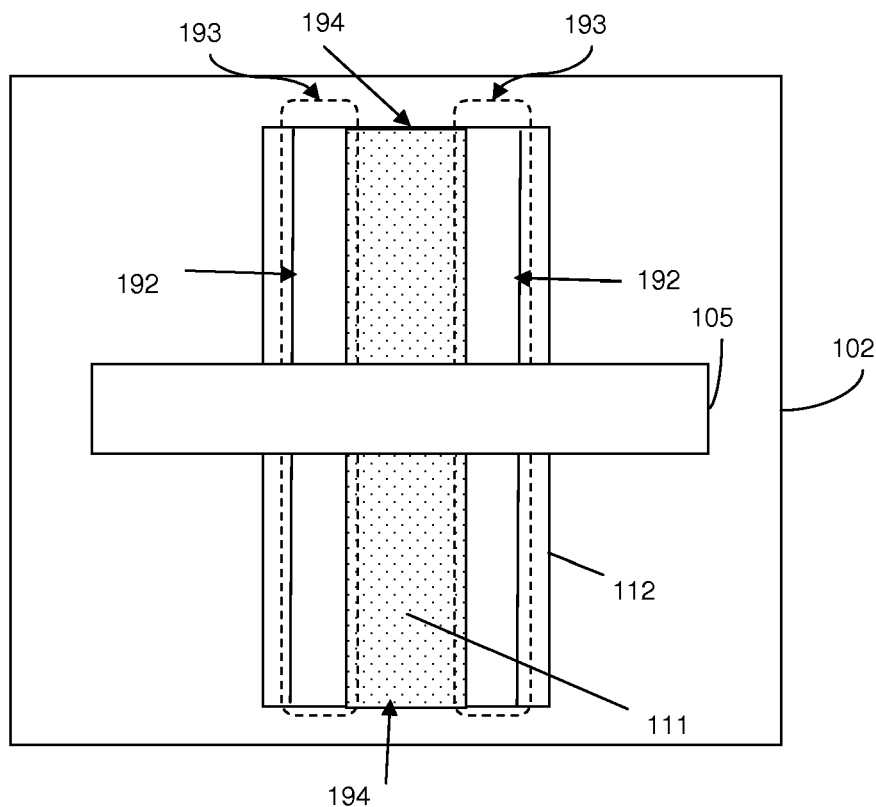
FIG. 17 is a schematic diagram illustrating a top view of a partially completed structure of the invention.
Figure 18:
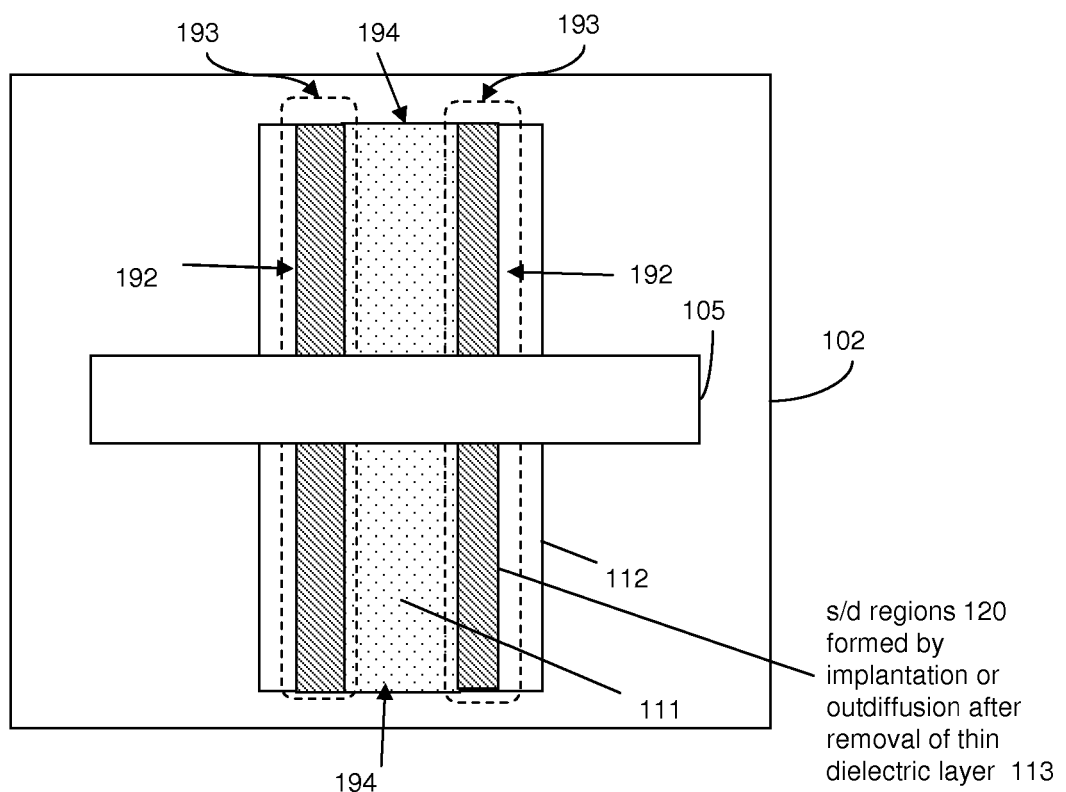
FIG. 18 is a schematic diagram illustrating a top view of a partially completed structure of the invention.

In one embodiment of the invention in order to further emphasize the channel corners of the resulting trigate FET and suppress the channel planes, source/drain regions 120 can be formed only in the upper corners 193 of the semiconductor body 120 adjacent to the gate conductor 105. For example, the upper corners 193 of the semiconductor body 150 that extend from the gate conductor 105 to the opposing ends 194 and that are not blocked by the gate conductor or by the thick gate dielectric layers (i.e., the first 111 and second 112 gate dielectric layers) can be implanted with a selected dopant to form source/drain diffusion regions 120 (526, see FIG. 16). Alternatively, the oxide layer 113 (i.e., the third gate dielectric layer 113, see FIG. 15) that was previously grown on the upper corners of the semiconductor body 120 (at process 516) and not blocked during the formation of the gate conductor 105 (at process 520) can be selectively removed from the upper corners 193 of the semiconductor body (see FIG. 17). Then, a film having a high-level of a selected dopant can be deposited so that the dopant can outdiffuse from the film into the upper corners 193 of the semiconductor body 120 between the gate conductor 105 and the opposing ends 194 (see FIG. 18).

Figure 19:
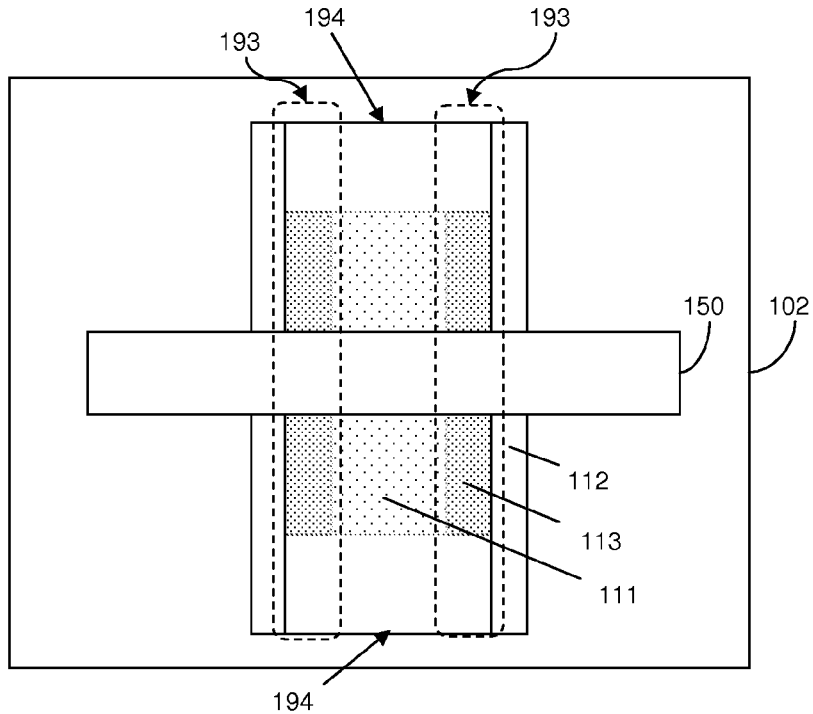
FIG. 19 is a schematic diagram illustrating a top view of a partially completed structure of the invention.
Figure 20:
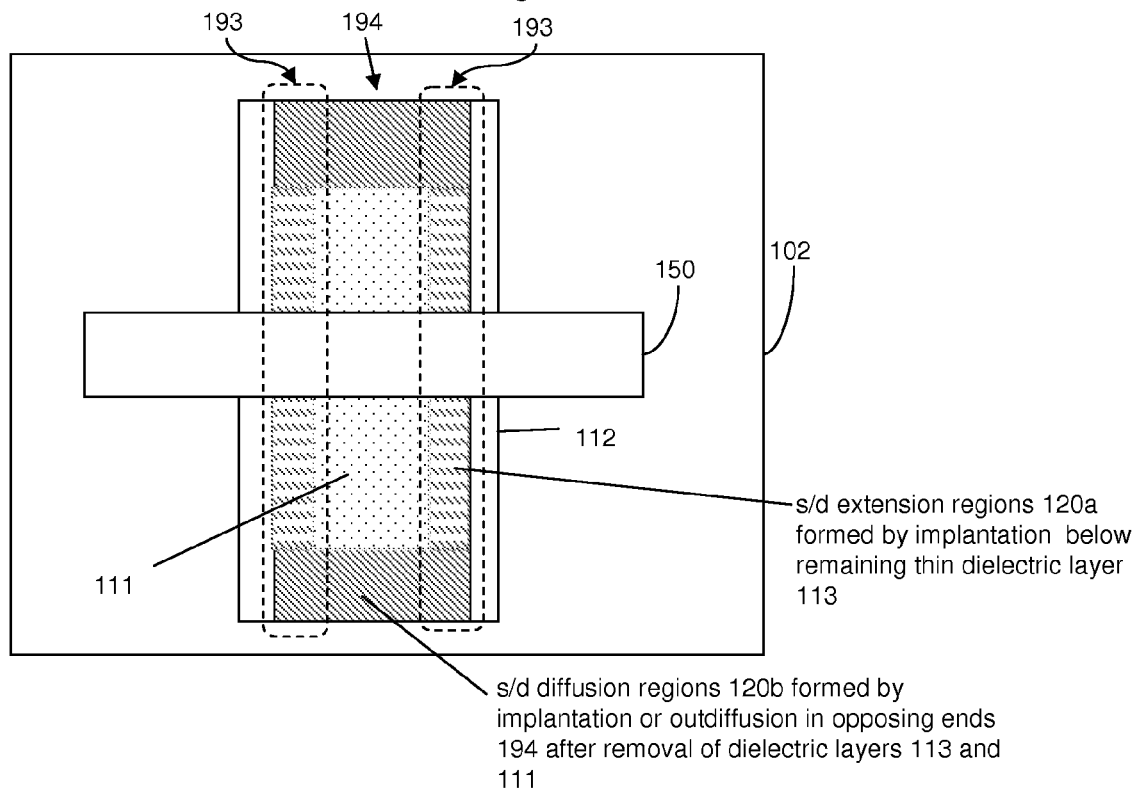
FIG. 20 is a schematic diagram illustrating a top view of a partially completed structure of the invention.
Figure 21:
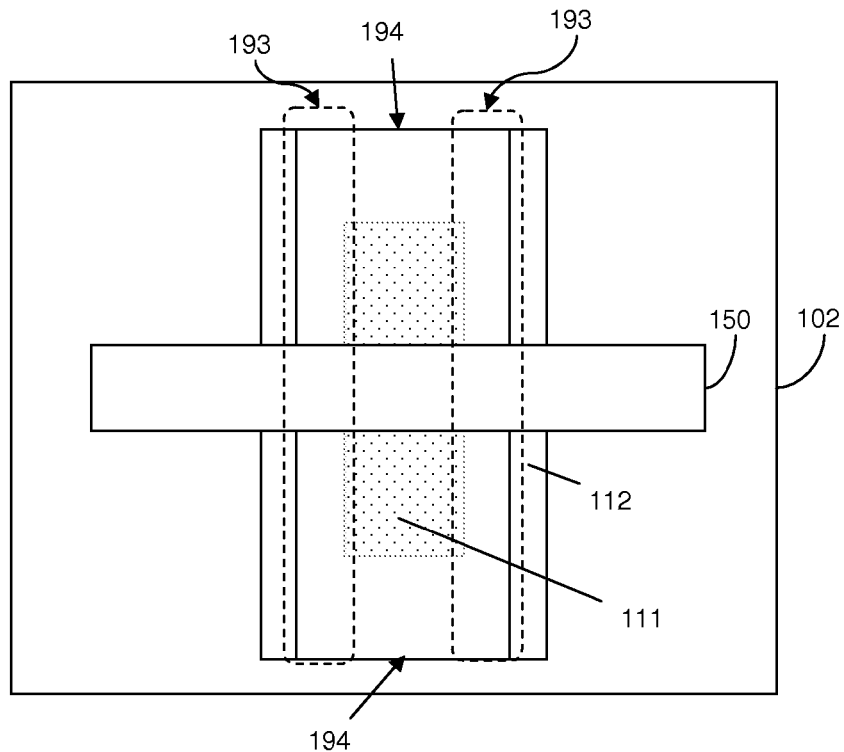
FIG. 21 is a schematic diagram illustrating a top view of a partially completed structure of the invention.
Figure 22:
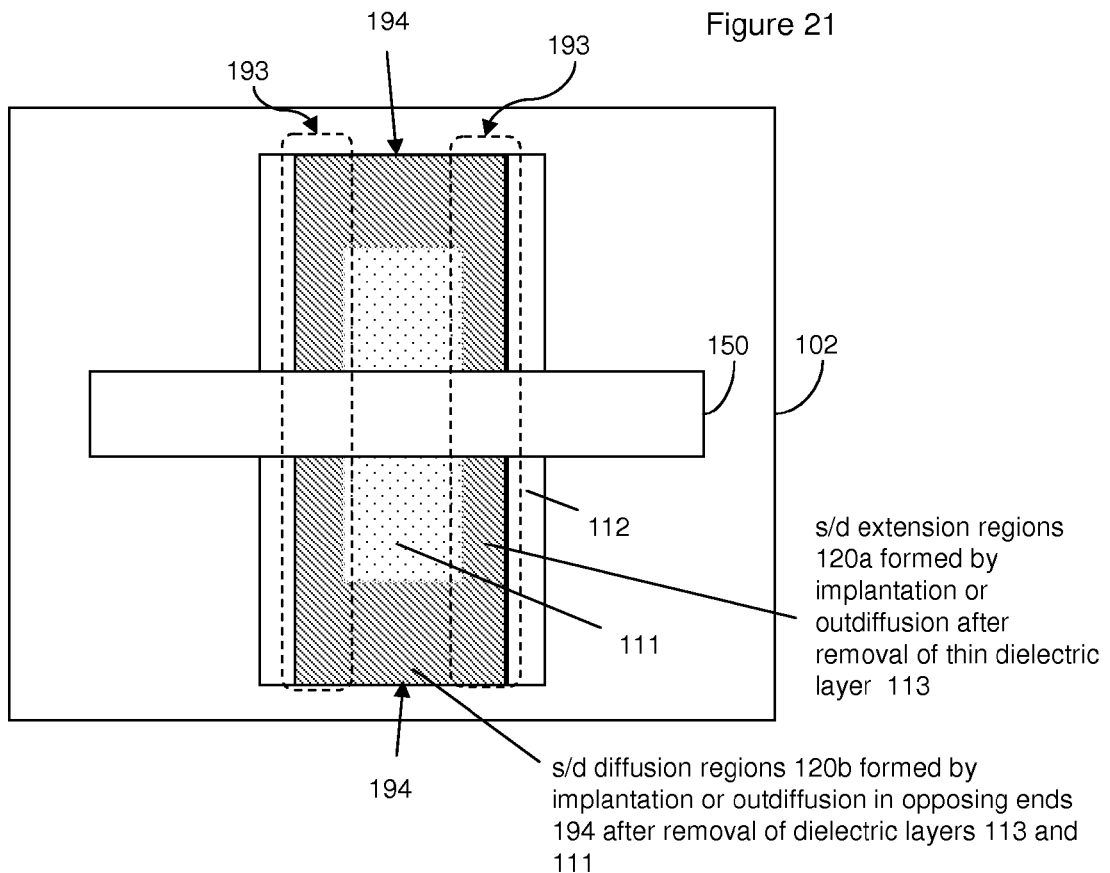
FIG. 22 is a schematic diagram illustrating a top view of a partially completed structure of the invention.

In another embodiment of the invention in order to further emphasize the channel corners of the resulting trigate FET and suppress the channel planes, source/drain extension regions 120a can be formed in the upper corners 193 of the semiconductor body 120 adjacent to the gate conductor 105 and deep source/drain diffusion regions 120b can be formed throughout the opposing ends 194 of the semiconductor body 120. For example, portions of the first gate dielectric layer 111 and the oxide layer 113 (i.e., the third gate dielectric layer 113) on the top surface 191 of the semiconductor body 150 at the opposing ends 194 can be removed and, optionally, the remaining exposed oxide layer 113 in the upper corners 193 adjacent to the gate conductor 105 can also be removed (528, see detailed discussion above and FIG. 19). The process 528 can be accomplished by patterning a mask over the structure such that the opposing ends of the semiconductor body are exposed. Then, an appropriate etch process can be performed to remove the dielectric layers from the opposing ends. The mask can be removed and a controlled directional etch process can, optionally, be performed to remove the remainder of the exposed oxide layer 113 without completely removing the first dielectric layer 111. Following process 528, an implantation process can be performed such that a first lower concentration of dopants is implanted in the upper corners 193 of the semiconductor body 150 adjacent to the gate conductor 105 to form source/drain extension regions 120a and a second higher concentration of the dopant is implanted into the opposing ends 194 of the semiconductor body 150 to form deep source/drain diffusion regions 120b (530, see FIG. 20). The different concentrations can be achieved by conducting a two-stage implantation process in which the source/drain extension regions are masked during one of the stages. Alternatively, if the oxide layer 113 is completely removed (i.e., removed from both the opposing ends 194 and the upper corners 193 of the semiconductor body 120) (at process 528, see FIG. 21), then an outdiffusion process may be used to introduce the dopant into both the upper corners and opposing ends of the semiconductor body 120 to form the source/drain extension regions 120a and source/drain diffusion regions 120b, respectively. For example, after the removal of the selected dielectric layers at process 528, a film having a high level of the dopant can be deposited so that the dopant can be outdiffused into the upper corners and the opposing ends (see FIG. 22). This outdiffusion process can be controlled using well-known techniques so that a first lower concentration of the dopant is outdiffused into the upper corners of the semiconductor body adjacent to the gate conductor to form source/drain extension regions and a second higher concentration of the dopant is outdiffused into the opposing ends of the semiconductor body to form source/drain diffusion regions. Alternatively, different doping levels between the source/drain extension regions 120a and deep source/drain diffusion regions 120b can be accomplished by a combination of the above-described implantation and outdiffusion processes.

In order to complete the trigate FET structure 100, additional well-known processing steps may be performed (e.g., forming halos, forming spacers, depositing and planarizing an insulator, forming gate contacts, forming source/drain contacts, etc.) (532).

Therefore, disclosed above are embodiments of a trigate FET structure that suppresses the vertical and horizontal channel planes within the channel region so as to minimize parasitic capacitances, that optimizes the current carrying capabilities of the channel corners and that has dimensions that can be manufactured using current state-of-the art technology. This trigate FET comprises a fin-shaped semiconductor body with a channel region and source/drain regions on either side of the channel region. Thick gate dielectric layers separate the top surface and opposing sidewalls of the channel region from the gate conductor in order to suppress conductivity in the vertical and horizontal channel planes. A thin gate dielectric layer separates the upper corners of the channel region from the gate conductor in order to optimize conductivity in the channel corners. To further emphasize the current carrying capabilities in the channel corners, the source/drain regions can be formed so that they exist only in the upper corners of the semiconductor body. Alternatively, the source/drain regions can be formed so that source/drain extension regions exist only in the upper corners of the semiconductor body adjacent to the gate conductor and deep source/drain diffusion regions exist in the entire semiconductor body some distance away from the gate conductor. Thus, a trigate FET structure is achieve that simultaneously exhibits very low parasitic capacitance and resistance.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A method of forming a field effect transistor, said method comprising:
   patterning a first dielectric material on a top surface of a semiconductor layer to form a first gate dielectric layer;
   forming spacers adjacent to said first gate dielectric layer;
   performing a directional etch of said semiconductor layer to form a semiconductor body below said first gate dielectric layer and said spacers;
   forming a second gate dielectric layer on opposing sidewalls of said semiconductor body; and
   forming a third gate dielectric layer on upper corners of said semiconductor body adjacent to said first gate dielectric layer and said second gate dielectric layer, wherein both said first gate dielectric layer and said second gate dielectric layer are formed thicker than said third gate dielectric layer.

2. The method of claim 1, all the limitations of which are incorporated herein by reference, wherein said forming of said second gate dielectric layer comprises:
   depositing a second dielectric material that is different from said first gate dielectric material; and
   performing a selective directional etch to remove said second dielectric material from said first gate dielectric layer and said spacers, to remove said spacers, and to remove said second dielectric material from said opposing sidewalls at said upper corners,
   wherein a portion of said second dielectric material remaining on said opposing sidewalls forms said second gate dielectric layer.

3. The method of claim 1, all the limitations of which are incorporated herein by reference, wherein said forming of said second gate dielectric layer comprises:
   removing said spacers;
   depositing a second dielectric material that is different from said first gate dielectric material; and
   performing a selective directional etch to remove said second dielectric material from said first gate dielectric layer and from said opposing sidewalls at said upper corners,
   wherein a portion of said second dielectric material remaining on said opposing sidewalls forms said second gate dielectric layer.

4. The method of claim 1, all the limitations of which are incorporated herein by reference, wherein said forming of said third gate dielectric layer comprises growing an oxide layer on said semiconductor body around said upper corners.

5. The method of claim 4, all the limitations of which are incorporated herein by reference, wherein growth of said oxide layer is controlled so that said third gate dielectric layer is formed less than approximately $1/3$ as thick as said second gate dielectric layer.

6. The method of claim 1, all the limitations of which are incorporated herein by reference, wherein said first gate dielectric layer is formed such that the width of said first gate dielectric layer is at least one third the width of said top surface and wherein said second gate dielectric layer is formed such that the height of said second gate dielectric layer is at least one third the height of said opposing sidewalls.

7. A method of forming a field effect transistor, said method comprising:
   patterning a first dielectric material on a top surface of a semiconductor layer to form a first gate dielectric layer;
   forming spacers adjacent to said first gate dielectric layer;
   performing a directional etch of said semiconductor layer to form a semiconductor body below said first gate dielectric layer and said spacers;
   forming a second gate dielectric layer on opposing sidewalls of said semiconductor body;
   forming a third gate dielectric layer on upper corners of said semiconductor body adjacent to said first gate dielectric layer and said second gate dielectric layer, wherein both said first gate dielectric layer and said second gate dielectric layer are formed thicker than said third gate dielectric layer;
   patterning a gate conductor on said semiconductor body; and
   doping said upper corners adjacent to said gate conductor to form source/drain regions.

8. The method of claim 7, all the limitations of which are incorporated herein by reference, wherein said doping comprises one of performing an implantation process, performing an outdiffusion process, and performing a combination of implantation and outdiffusion processes.

9. The method of claim 7, all the limitations of which are incorporated herein by reference, further comprising before said doping, removing said first dielectric layer and said third gate dielectric layer from said top surface at opposing ends of said semiconductor body and, optionally, removing said third gate dielectric layer from said upper corners of said semiconductor body adjacent said gate conductor such that said doping introduces a dopant into said upper corners adjacent to said gate conductor in order to form source/drain extension regions and into said opposing ends in order to form source/drain diffusion regions.

10. The method of claim 7, all the limitations of which are incorporated herein by reference, wherein said forming of said second gate dielectric layer comprises:
   depositing a second dielectric material that is different from said first dielectric material; and
   performing a selective directional etch to remove said second dielectric material from said first gate dielectric layer and said spacers, to remove said spacers, and to remove said second dielectric material from said opposing sidewalls at said upper corners,
   wherein a portion of said second dielectric material remaining on said opposing sidewalls forms said second gate dielectric layer.

11. The method of claim 7, all the limitations of which are incorporated herein by reference, wherein said forming of said second gate dielectric layer comprises:
   removing said spacers;
   depositing a second dielectric material that is different from said first gate dielectric material; and
   performing a selective directional etch to remove said second dielectric material from said first gate dielectric layer and from said opposing sidewalls at said upper corners,
   wherein a portion of said second dielectric material remaining on said opposing sidewalls forms said second gate dielectric layer.

12. The method of claim 7, all the limitations of which are incorporated herein by reference, wherein said forming of said third gate dielectric layer comprises growing an oxide layer on said semiconductor body on said upper corners.

13. The method of claim 12, all the limitations of which are incorporated herein by reference, wherein growth of said oxide layer is controlled so that said third gate dielectric layer is formed less than approximately ⅓ as thick as said second gate dielectric layer.

14. The method of claim 7, all the limitations of which are incorporated herein by reference, wherein said first gate dielectric layer is formed such that the width of said first gate dielectric layer is at least one third the width of said top surface and wherein said second gate dielectric layer is formed such that the height of said second gate dielectric layer is at least one third the height of said opposing sidewalls.

15. A program storage device readable by computer, tangibly embodying a program of instructions executable by said computer to perform a method of forming a field effect transistor, said method comprising:
   patterning a first dielectric material on a top surface of a semiconductor layer to form a first gate dielectric layer;
   forming spacers adjacent to said first gate dielectric layer;
   performing a directional etch of said semiconductor layer to form a semiconductor body below said first gate dielectric layer and said spacers;
   forming a second gate dielectric layer on opposing sidewalls of said semiconductor body; and
   forming a third gate dielectric layer on upper corners of said semiconductor body adjacent to said first gate dielectric layer and said second gate dielectric layer, wherein both said first gate dielectric layer and said second gate dielectric layer are formed thicker than said third gate dielectric layer.

16. The program storage device of claim 15, all the limitations of which are incorporated herein by reference, wherein said forming of said second gate dielectric layer comprises:
   depositing a second dielectric material that is different from said first gate dielectric material; and
   performing a selective directional etch to remove said second dielectric material from said first gate dielectric layer and said spacers, to remove said spacers, and to remove said second dielectric material from said opposing sidewalls at said upper corners,
   wherein a portion of said second dielectric material remaining on said opposing sidewalls forms said second gate dielectric layer.

17. The program storage device of claim 15, all the limitations of which are incorporated herein by reference, wherein said forming of said second gate dielectric layer comprises:
   removing said spacers;
   depositing a second dielectric material that is different from said first gate dielectric material; and
   performing a selective directional etch to remove said second dielectric material from said first gate dielectric layer and from said opposing sidewalls at said upper corners,
   wherein a portion of said second dielectric material remaining on said opposing sidewalls forms said second gate dielectric layer.

18. The program storage device of claim 15, all the limitations of which are incorporated herein by reference, wherein said forming of said third gate dielectric layer comprises growing an oxide layer on said semiconductor body around said upper corners.

19. The program storage device of claim 18, all the limitations of which are incorporated herein by reference, wherein growth of said oxide layer is controlled so that said third gate dielectric layer is formed less than approximately ⅓ as thick as said second gate dielectric layer.

20. The program storage device of claim 15, all the limitations of which are incorporated herein by reference, wherein said first gate dielectric layer is formed such that the width of said first gate dielectric layer is at least one third the width of said top surface and wherein said second gate dielectric layer is formed such that the height of said second gate dielectric layer is at least one third the height of said opposing sidewalls.

* * * * *